(12) United States Patent
Shimizu et al.

(10) Patent No.: US 6,741,478 B2
(45) Date of Patent: May 25, 2004

(54) COMPACT ELECTRONIC CIRCUIT UNIT HAVING CIRCULATOR, MANUFACTURED WITH HIGH PRODUCTIVITY

(75) Inventors: Yuichi Shimizu, Fukushima-ken (JP); Nobuhiko Suzuki, Kanagawa-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 66 days.

(21) Appl. No.: 09/904,950

(22) Filed: Jul. 12, 2001

(65) Prior Publication Data

US 2002/0006035 A1 Jan. 17, 2002

(30) Foreign Application Priority Data

Jul. 14, 2000 (JP) ........................................ 2000-218731
Sep. 7, 2000 (JP) ........................................ 2000-276622

(51) Int. Cl.[7] .......................... H05K 7/02; H05K 7/06; H05K 7/08; H05K 7/10
(52) U.S. Cl. .................. 361/760; 361/814; 333/1.1
(58) Field of Search .................. 361/760–762, 361/763–766, 775, 780–786, 792–795, 814, 816, 818; 333/1.1, 24.2; 156/150; 29/602.1, 607, 592.1; 252/62.6

(56) References Cited

U.S. PATENT DOCUMENTS 3,673,518 A * 6/1972 Carr ........................ 333/1.1
3,836,874 A * 9/1974 Maeda et al. ................. 333/1.1
4,761,621 A * 8/1988 Kane et al. .................... 333/1.1
5,450,045 A * 9/1995 Miura et al. ................... 333/1.1
5,776,275 A * 7/1998 Krishnamurthy et al. ... 156/150
5,923,224 A * 7/1999 Makino et al. ............... 333/1.1
6,020,793 A * 2/2000 Makino et al. ............... 333/1.1
6,222,425 B1 * 4/2001 Okada et al. ................. 333/1.1

FOREIGN PATENT DOCUMENTS

| JP | 6-140813 | 5/1994 |
|---|---|---|
| JP | 10-173409 | 6/1998 |

* cited by examiner

*Primary Examiner*—Kamand Cuneo
*Assistant Examiner*—Tuan Dinh
(74) *Attorney, Agent, or Firm*—Brinks Hofer Gilson & Lione

(57) ABSTRACT

An electronic circuit unit having a circulator is formed of a circuit board made by laminating a plurality of dielectric substrates; first, second, and third central conductors disposed at intervals of 120 degrees on a plurality of dielectric substrates and partially intersecting in the upper and lower directions; a magnet and a ferrite member disposed above and below the intersection of the central conductors; a first yoke 10 covering the outside of the magnet; and a second yoke 11 covering the outside of the ferrite member. One end of each of the central conductors serves as an input and output terminal, and the ends are disposed at intervals of 120 degrees. Adjacent input and output terminals are connected by inductive elements.

13 Claims, 11 Drawing Sheets

COMPACT ELECTRONIC CIRCUIT UNIT HAVING CIRCULATOR, MANUFACTURED WITH HIGH PRODUCTIVITY

BACKGROUND OF THE INVENTION

1. Field of the Invention

The present invention relates to electronic circuit units having a circulator in which a central conductor to be placed in a magnetic field is mounted in a circuit board.

2. Description of the Related Art

A conventional circulator S2 will be described below with reference to FIGS. 14 and 15. The circulator S2 is formed of a plurality of laminated dielectric substrates 52 having three central conductors 51 arranged at intervals of 120 degrees and disposed so as to partially intersect each other, a magnet 53 and a ferrite member (not shown) disposed above and below the intersection of the central conductors 51, a first yoke 54 made from a magnetic member and disposed so as to cover the outside of the magnet 53 above the intersection, and a second yoke 55 made from a magnetic member, connected to the first yoke 54, and disposed so as to cover the outside of the ferrite member positioned below the intersection.

In the circulator S2, the first and second yokes 54 and 55 form a closed magnetic circuit. Input and output terminals 51a are provided for the three central conductors 51 and protrude toward the outside from the side faces of the first and second yokes 54 and 55. The circulator S2 is thus formed as a single product.

A circuit board 56 serving as an antenna combining unit is provided with a hole 56a and a plurality of electrically conductive patterns 57 disposed around the hole 56a. On the circuit board 56, various electric components (not shown) are mounted to form a desired electronic circuit.

The circulator S2, formed as a single product, is positioned in the hole 56a of the circuit board 56, and the terminals 51a of the central conductors 51 and a ground electrode (not shown) are placed on electrically conductive patterns 57 and connected thereto by soldering or other methods. An electronic circuit unit having the conventional circulator is thereby formed.

In the circulator having the above-described structure, a signal input to any of the input and output terminals is output from another input and output terminal disposed in one rotation direction, but is not output from another input and output terminal disposed in the opposite rotation direction. This phenomenon is called the Faraday effect.

In the electronic circuit unit having the conventional circulator, since the circulator S2 is formed as a single product and is soldered to the circuit board 56, the electronic circuit unit is costly to manufacture, needs a large space on the circuit board, and has a large overall size.

Moreover, and as shown in FIG. 16, since the central conductors are opposed to each other through dielectric substrates, distributed large-capacitive components C are formed among the central conductors at intersection points P. Therefore, the central conductors are coupled with each other by the distributed capacitive components C. An equivalent circuit shown in FIG. 17 is generated between an input and output terminal and the next input and output terminal disposed in the opposite rotation side, to which a signal is not to be output, and a signal is actually output through a distributed capacitive component C.

SUMMARY OF THE INVENTION

Accordingly, it is an object of the present invention to provide a compact electronic circuit unit having a circulator that is manufactured with high productivity to reduce the level of an output signal leaked to an input and output terminal to which the signal is not to be output by the Faraday effect.

The foregoing object is achieved in one aspect of the present invention through the provision of an electronic circuit unit having a circulator, including a circuit board which is obtained by laminating a plurality of dielectric substrates and in which an electric component is provided to form a desired electronic circuit. First, second, and third central conductors are provided on the circuit board and partially intersect with each other in the upper and lower directions. A magnet and a ferrite member are disposed above and below the intersection of the central conductors. A first yoke covers the outside of the magnet, and a second yoke covers the outside of the ferrite member. Wherein the first, second, and third central conductors are provided for a plurality of dielectric substrates and formed by laminating the plurality of dielectric substrates; a cavity for accommodating the ferrite member is provided at a lower section of the circuit board in which the central conductors are disposed; a plurality of through holes vertically passing through the circuit board are filled with a magnetic material; and a magnetic path is formed by the magnetic material between the first and second yokes disposed above and below the circuit board so as to cover the magnet and the ferrite member, to make a closed magnetic circuit.

The magnetic material may be formed by filling the through holes with a paste including a magnetic powder.

The electronic circuit unit having a circulator may be configured such that at least one of the first and second yokes has a cylindrical side wall, and the dielectric substrate is provided with a ring-shaped magnetic pattern which opposes the end section of the side wall and which is connected to the magnetic material.

The magnetic pattern may be provided for each of the dielectric substrates positioned between the first and second yokes.

The electronic circuit unit having a circulator may be configured such that the ferrite member is disposed in the cavity; the magnet is disposed on the upper surface of the circuit board; the first yoke having the cylindrical side wall is disposed so as to cover the outside of the magnet; and the second yoke having a plane shape is disposed so as to cover the outside of the ferrite member and to block the cavity.

The electronic circuit unit having a circulator may be configured such that an electrically conductive pattern is provided on the front surface of a first-layer dielectric substrate disposed at the top of the circuit board; the first, second, and third central conductors are provided for dielectric substrates disposed below the first-layer dielectric substrate; and one end of each of the first, second, and third central conductors is connected to the electrically conductive pattern by a through-hole conductor provided in the circuit board.

The other end of each of the first, second, and third central conductors may be grounded through a through-hole conductor provided in the circuit board at a position closer to the center than the ring-shaped magnetic pattern.

The through-hole conductor connected to the other end of each of the first, second, and third central conductors may be connected to one highly electrically conductive member.

The electronic circuit unit having a circulator may be configured such that a capacitor for the circulator is provided on the upper surface of the circuit board by printing at a position outside the first yoke, and the capacitor can be trimmed after the first yoke has been mounted.

The foregoing object is achieved in another aspect of the present invention through the provision of an electronic circuit unit having a circulator, including a circuit board obtained by laminating a plurality of dielectric substrates. First, second, and third central conductors are provided for the plurality of dielectric substrates at intervals of 120 degrees and partially intersecting with each other in the upper and lower directions. A magnet and a ferrite member are disposed above and below the intersection of the central conductors. A first yoke covers the outside of the magnet, and a second yoke covers the outside of the ferrite member. Wherein one end of each of the first, second, and third central conductors serves as an input and output terminal, the ends being disposed at intervals of 120 degrees, and adjacent input and output terminals are connected by inductive elements.

The electronic circuit unit having a circulator may be configured such that electrically conductive patterns connected to the input and output terminals, and microstriplines for connecting the electrically conductive patterns, are provided on the circuit board. The microstriplines are formed of the inductive elements.

The resonant frequency of a parallel resonant circuit formed of the inductive elements and capacitive components generated between the central conductors by the intersections of the central conductors may be made equal to the frequency of a signal input to an input and output terminal.

DESCRIPTION OF THE PREFERRED EMBODIMENTS

Figure 1:
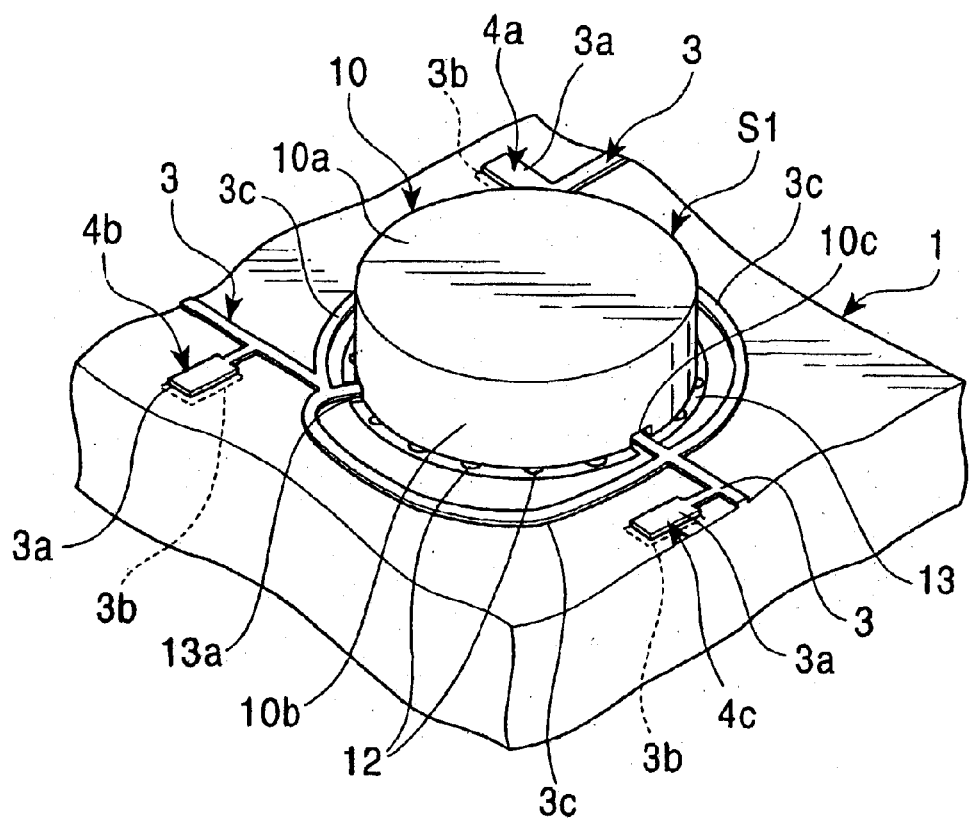
FIG. 1 is a perspective view of a circulator according to the present invention.
Figure 2:
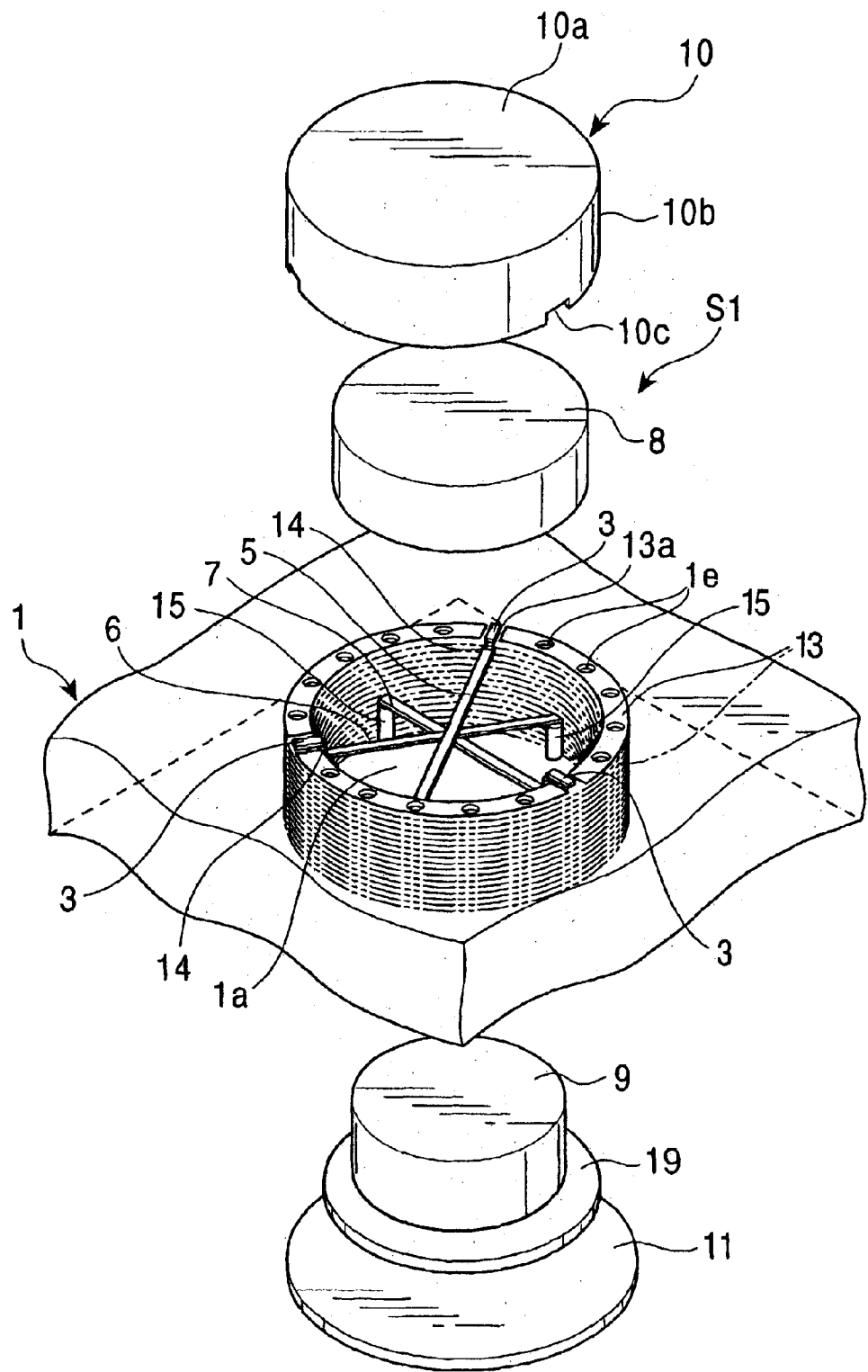
FIG. 2 is an exploded perspective view of the circulator.
Figure 3:
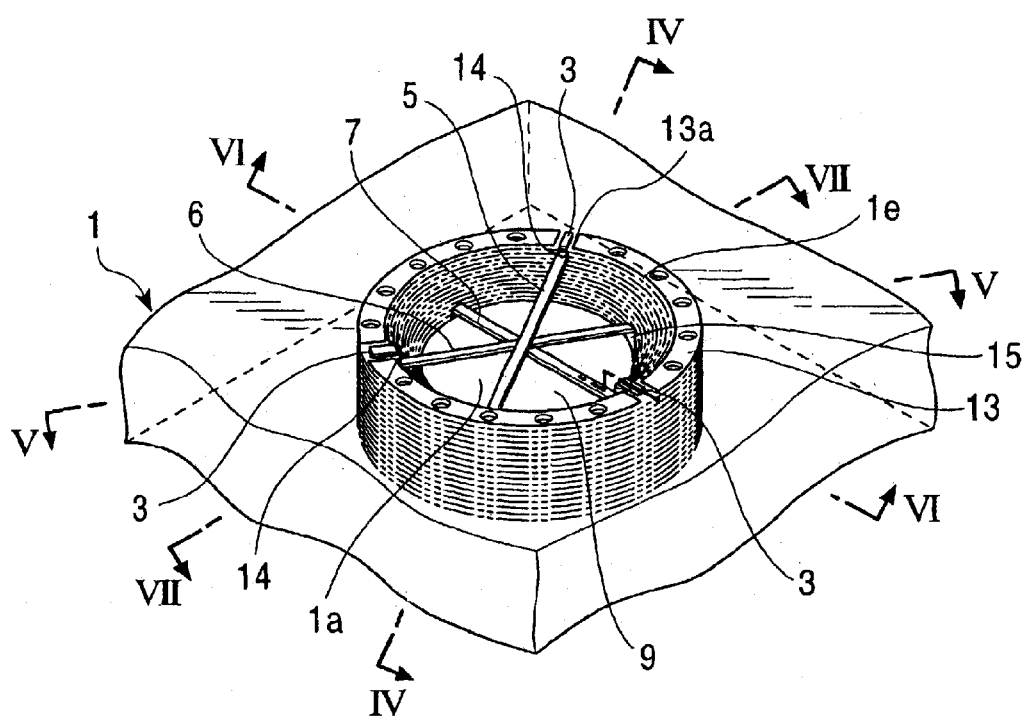
FIG. 3 is a perspective view showing the structure of a circuit board used for the circulator.
Figure 8:
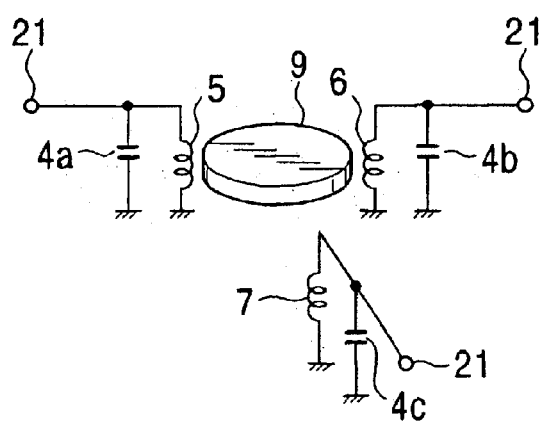
FIG. 8 is an equivalent circuit diagram of the circulator, obtained among three input and output terminals.

FIG. 1 is a perspective view of a main section of a circulator according to the present invention. FIG. 2 is an exploded perspective view of the circulator. FIG. 3 is a perspective view showing the structure of a circuit board used for the circulator. FIG. 4 to FIG. 7 are cross-sectional views of the circulator. FIG. 8 is an equivalent circuit diagram of the circulator.

The structure of an electronic circuit unit having the circulator according to the present invention will be described below with reference to FIGS. 1 to 8. A circuit board 1 used for an electronic circuit unit, such as an antenna combining unit, is formed by laminating a plurality of dielectric substrates 2 made from ceramic green sheets.

In the circuit board 1, electrically conductive patterns 3 having desired shapes are formed on the front surface of a first-layer dielectric substrate 2 disposed at the top, on the lower surface of a dielectric substrate 2 disposed at the bottom, and among dielectric substrates 2 disposed therebetween, and are electrically connected via through-hole conductors (described later).

On the upper surface of the circuit board 1, various electric parts (not shown) having chip shapes or formed by printing are provided, such as capacitors $4a$, $4b$, and $4c$ (formed by printing), to form a desired electronic circuit.

The capacitors $4a$, $4b$, and $4c$ are formed of electrodes $3a$ made from electrically conductive patterns 3 provided on the upper surface of the circuit board 1, ground patterns $3b$ formed in the circuit board 1, and dielectric substrates 2 sandwiched therebetween. The capacitors $4a$, $4b$, and $4c$ may also be chip-type capacitors.

The circulator S1 according to the present invention is formed of first, second, and third central conductors 5, 6, and 7, respectively, made from copper-foil patterns partially intersecting in the upper and lower directions, a magnet 8 and a ferrite member 9 disposed above and below an intersection, first and second yokes 10 and 11 made from a magnetic member for covering the outsides of the magnet 8 and the ferrite member 9, a magnetic material 12 disposed between the first and second yokes 10 and 11, and ring-shaped magnetic patterns 13.

The first central conductor 5 is formed by printing on the upper surface of a dielectric substrate 2 serving as a second layer from the upper surface of the circuit board 1. The second central conductor 6 is formed by printing on the upper surface of a dielectric substrate 2 serving as a third layer from the upper surface of the circuit board 1. The third central conductor 7 is formed by printing on the upper surface of a dielectric substrate 2 serving as a fourth layer from the upper surface of the circuit board 1.

The plurality of dielectric substrates 2, on which the first, second, and third central conductors 5, 6, and 7 are formed, are stacked and laminated. The first, second, and third central conductors 5, 6, and 7 are disposed at intervals of 120 degrees such that their center sections intersect.

Specifically, the central conductors 5, 6, and 7 are formed on dielectric substrates 2 disposed lower than the first-layer dielectric substrate 2 on which an electrically conductive pattern 3 is formed.

Under the first-layer dielectric substrate 2 of the circuit board 1, a cavity 1a is provided opposite the first, second, and third central conductors 5, 6, and 7, and a shoulder section 1b, formed of a cut section, is formed around the cavity 1a. The cavity 1a is blocked at its top by the first-layer to fourth-layer dielectric substrates 2 and is open at the bottom. The ferrite member 9 is placed in the cavity 1a and the magnet 8 is adhered to the upper surface of the circuit board by adhesive.

In other words, the magnet 8 and the ferrite member 9 are disposed so as to vertically sandwich the intersection of the first, second, and third central conductors 5, 6, and 7.

Figure 4:
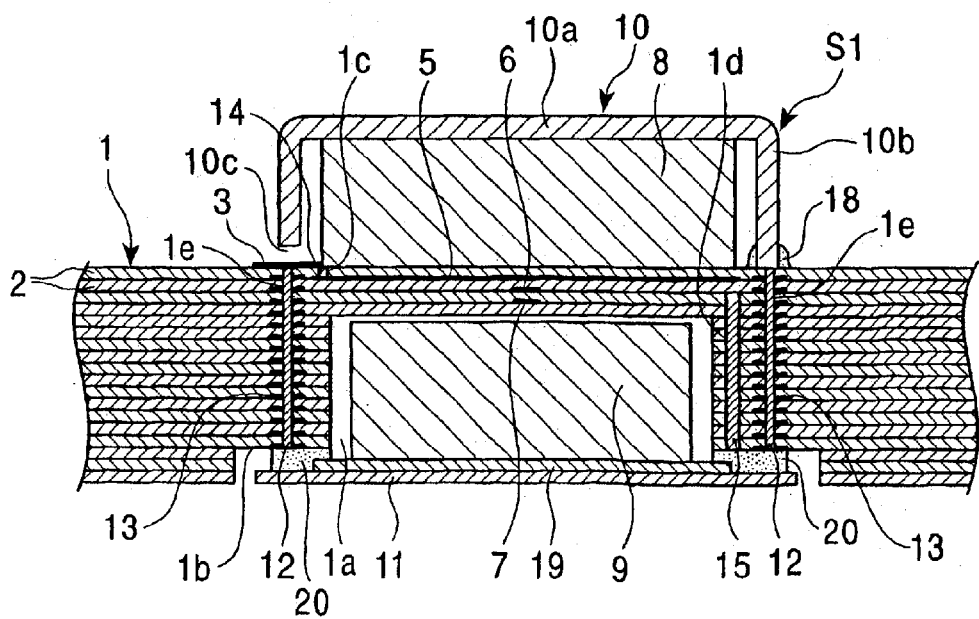
FIG. 4 is a cross-sectional view of the circulator, taken along line IV—IV of FIG. 3.
Figure 5:
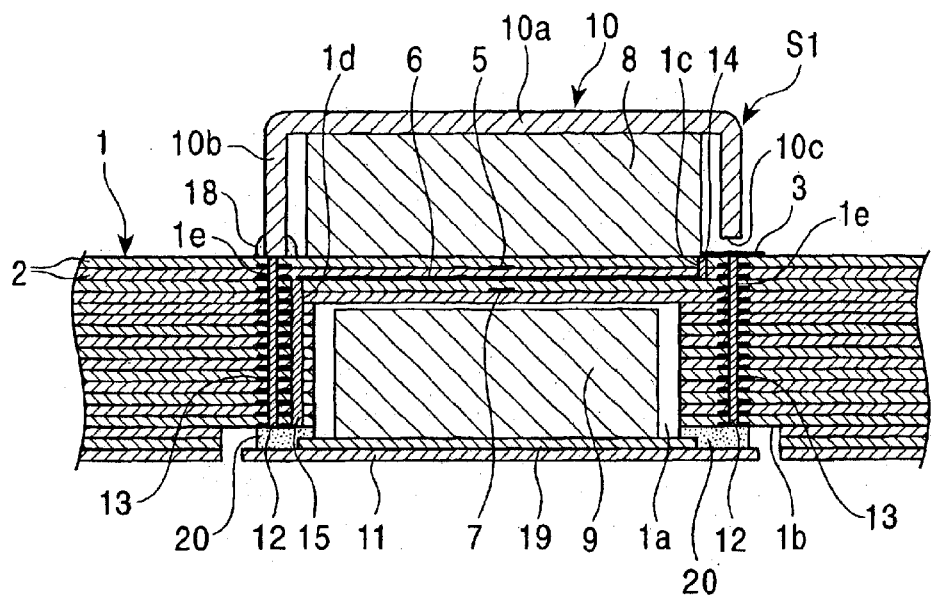
FIG. 5 is a cross-sectional view of the circulator, taken along line V—V of FIG. 3.
Figure 6:
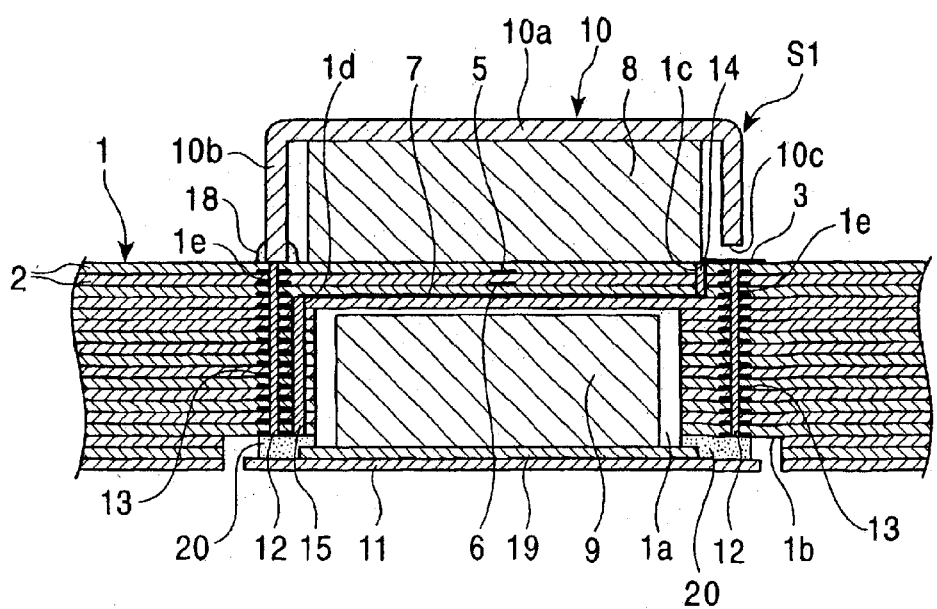
FIG. 6 is a cross-sectional view of the circulator, taken along line VI—VI of FIG. 3.
Figure 7:
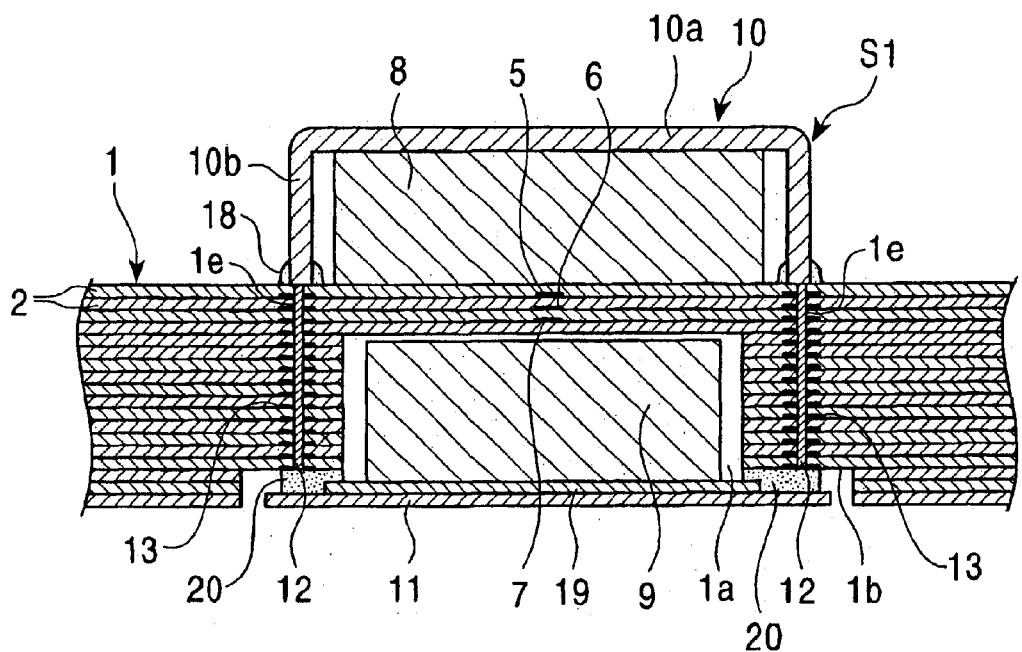
FIG. 7 is a cross-sectional view of the circulator, taken along line VII—VII of FIG. 3.

As shown in FIGS. 4 to 6, holes 1c are provided in the dielectric substrates 2 disposed above an end of each of the first, second, and third central conductors 5, 6, and 7. Each hole 1c is filled with a through-hole conductor 14 made from electrically conductive paste, such as silver paste, to connect the end of each of the first, second, and third central conductors 5, 6, and 7 to an electrically conductive pattern 3, and to an electrode 3a of the capacitors 4a, 4b, and 4c in the circulator S1. Each electrically conductive pattern 3 is connected to each other by a microstripline 3c provided on the upper surface of the circuit board 1 outside the first yoke (see FIG. 1). The microstripline 3c serves as an inductor.

Also as shown in FIGS. 4 to 6, holes 1d are provided in the dielectric substrates disposed below the other end of each of the first, second, and third central conductors 5, 6, and 7. Each hole 1d is filled with a through-hole conductor 15 made from electrically conductive paste, such as silver paste, and the through-hole conductor 15 connected to the other end of each of the first, second, and third central conductors 5, 6, and 7, and is exposed at the lower surface of the shoulder section 1b.

In the circuit board 1, as shown in FIGS. 4 to 7, a plurality (about 30 at an interval of 0.4 mm) of vertical through holes 1e are provided on the same circumference around the cavity 1a. In the dielectric substrate 2 serving as the first layer from the top, at an area where the electrically conductive pattern 3 which is connected to the end of each of the first, second, and third central conductor 5, 6, and 7 is formed, a through hole 1e is omitted so as to insulate from the electrically conductive pattern 3.

The ring-shaped magnetic patterns 13 are formed in the dielectric substrates 2 constituting the circuit board 1, as shown in FIGS. 1 to 7, on the upper surface of the first-layer dielectric substrate 2 disposed at the top, on the lower surface of a dielectric substrate 2 disposed at the shoulder section 1b, and between all dielectric substrates 2.

The magnetic patterns 13 are formed by printing a paste including copper and nickel on dielectric substrates 2, and then by burning. The magnetic patterns 13 have cut sections 13a at which the magnetic patterns 13 are partially cut so as not to contact an electrically conductive pattern 3 and the first, second, and third central conductors 5, 6, and 7 at the first-layer dielectric substrate 2 on which the electrically conductive pattern 3 is formed and the second-layer, third-layer, and fourth-layer dielectric substrates on which the first, second, and third central conductors 5, 6, and 7 are formed.

Each through hole 1e is filled with a magnetic material 12 made from a paste including a magnetic powder such as copper and nickel. The magnetic material 12 is fixed in a condition in which the magnetic material 12 contacts each magnetic pattern 13, so that a magnetic path is formed by the ring-shaped magnetic patterns 13 and the magnetic material 12.

The magnetic patterns 13 are connected to the through-hole conductors 15 outside the other end of each of the first, second, and third central conductors 5, 6, and 7, namely, in a condition in which the other end of each of the first, second, and third central conductors 5, 6, and 7 is closer to the center than the ring-shaped magnetic patterns 13.

The first yoke 10 has an upper wall 10a, a cylindrical side wall 10b bent perpendicularly at the end section of the upper wall 10a, and three cut sections 10c at the end section of the side wall 10b. The first yoke 10 covers the outside of the magnet 8 placed on the upper surface of the circuit board 1 and is placed on the circuit board 1 such that the cut sections 10c are positioned above electrically conductive patterns 3.

The side wall 10b is soldered to a ring-shaped magnetic pattern 13 at the entire end section except for the cut sections 10c, so that the first yoke 10 is mounted to the circuit board 1. In other words, the magnetic patterns 13 and the magnetic material 12 are formed along the end section of the side wall 10b of the first yoke 10. When the first yoke 10 is mounted, the end section of the side wall 10b contacts the magnetic pattern 13 and the magnetic material 12.

The second yoke 11 is formed of a circular magnetic plate. On the upper surface of the second yoke 11, a highly electrically conductive member 19 made from a highly electrically conductive metal plate, such as a copper plate, is disposed.

The second yoke 11 covers the outside of the ferrite member 9, and is disposed at the shoulder section 1b so as to block the opening section of the cavity 1a of the circuit board 1. The second yoke 11 is soldered by solder 20 to a magnetic pattern 13 and the through-hole conductors 15 to be mounted to the circuit board 1 together with the highly electrically conductive member 19. The solder 20 is also attached to a grounding pattern (not shown) provided at a surface of a lower-end section 1b to connect the highly electrically conductive member 19 and the through-hole conductors 15 to the ground.

When the first and second yokes 10 and 11 are mounted, a magnetic path is formed by the magnetic patterns 13 and the magnetic material 12 between the first and second yokes 10 and 11. As a result, the first and second yokes 10 and 11, the magnetic patterns 13, and the magnetic material 12 form a closed magnetic circuit.

When the second yoke 11 is mounted, the highly electrically conductive member 19 contacts the through-hole conductor 15 connected to the other end of each of the first, second, and third central conductors 5, 6, and 7 to improve the connection of the other end of each of the first, second, and third central conductors 5, 6, and 7 to the ground.

For the circulator S1 formed as described above, an equivalent circuit diagram is shown in FIG. 8. An input and output terminal 21 is provided at one end side of each of the first, second, and third central conductors 5, 6, and 7; the other end side of each of them is grounded; and the grounded capacitors 4a, 4b, and 4c are connected between the input and output terminals 21 and the first, second, and third central conductors 5, 6, and 7.

The electric performance of an electronic circuit unit in which the circulator S1 is built may be checked during assembly. Especially, the performance of the circulator S1 is checked when the first and second yokes 10 and 11 are assembled, and trimming is applied to the capacitors 4a, 4b, and 4c by cutting a part of the electrodes 3a to obtain a desired performance.

The first yoke 10 may be a pipe with a cross section of a polygon having four sides or more.

In the above embodiment, the through holes 1e are filled with a paste including a magnetic component to form the magnetic material 12. The magnetic material 12 may be formed of a plurality of protrusions extending from the end section of the side wall 10b of the first yoke 10. In this case, a magnetic path is formed by inserting the protrusions into the through holes 1e. When the through holes 1e are filled with solder paste and the protrusions are soldered to a magnetic pattern 13 by the solder paste, a more robust circuit board 1 is generated.

With the use of an alloy of silver and palladium, since silver has a low electric resistance and a high magnetic resistance, and palladium has a low magnetic resistance and a high electric resistance, the magnetic patterns 13 and the central conductors 5, 6, and 7 can be made from the same material and a good manufactuability is provided.

The magnetic patterns 13 may be made from copper plated with permalloy (an alloy of iron and nickel) or other alloys.

The magnetic material 12 may be made from permalloy paste or paste of other alloys.

Figure 9:
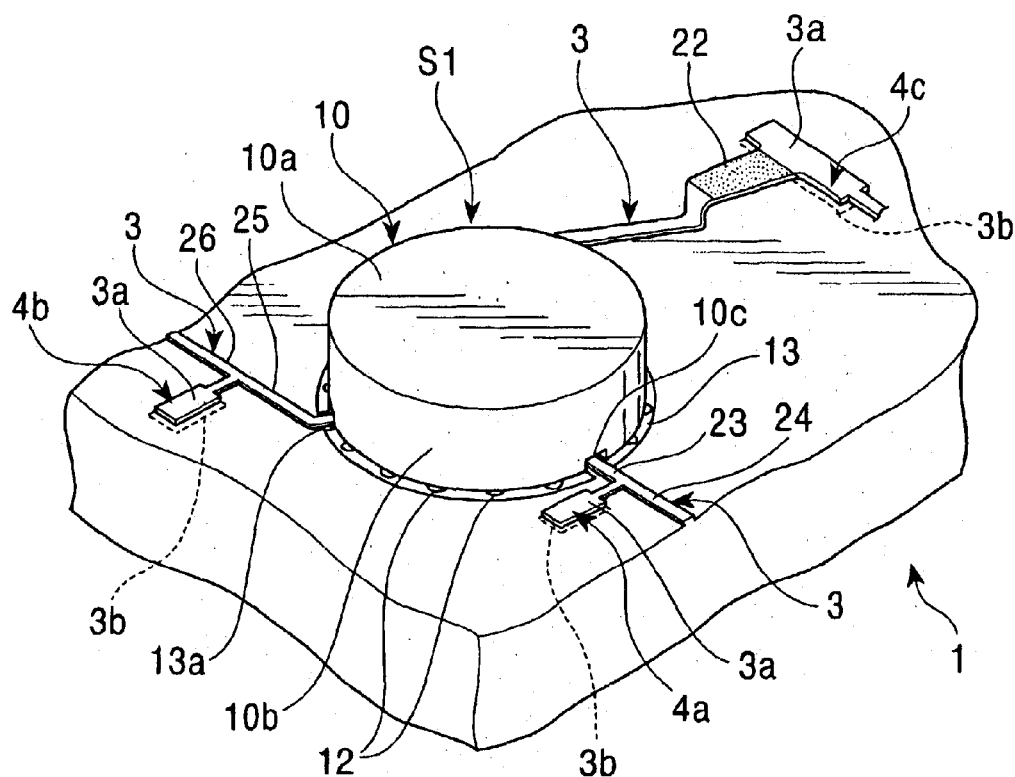
FIG. 9 is a perspective view of a main section of an isolator to which a circulator according to the present invention is applied.
Figure 10:
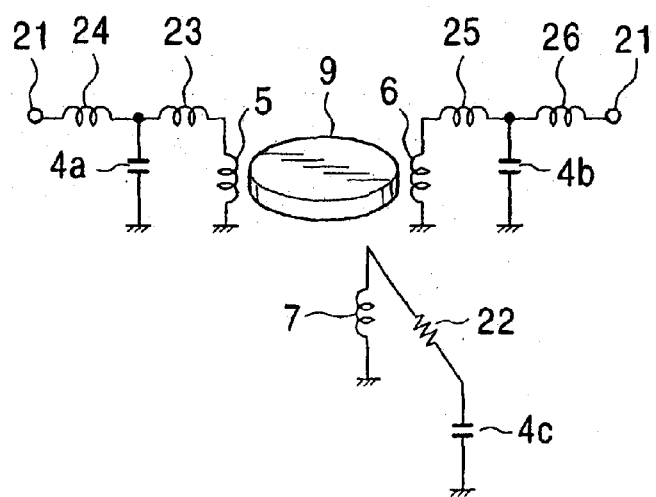
FIG. 10 is an equivalent circuit diagram of the isolator to which a circulator according to the present invention is applied.

FIGS. 9 and 10 show an isolator (nonreciprocal circuit device) according to an embodiment of the present invention, to which the circulator S1 is applied. In this embodiment, a capacitor 4c is connected to a third central conductor 7 through a resistor 22 formed on the upper surface of a circuit board 1. Since the other structures are the same as those described in the above embodiment, the same symbols as those used in the above embodiment are assigned to the same parts as those described in the above embodiment, and descriptions of the parts are omitted.

The resistor 22 may be a sheet-shaped resistive member formed on an insulating film, a chip-type resistor, or a printed-type resistor in which a resistive member is printed.

In such an isolator, as shown in FIGS. 9 and 10, a capacitor 4a is connected between an inductor 23 formed of an electrically conductive pattern 3 disposed between a first central conductor 5 and the capacitor 4a, and an inductor 24 formed of an electrically conductive pattern 3 disposed between the capacitor 4a and an input and output terminal 21. A capacitor 4b is connected between an inductor 25 formed of an electrically conductive pattern 3 disposed between a second central conductor 6 and the capacitor 4b, and an inductor 26 formed of an electrically conductive pattern 3 disposed between the capacitor 4b and an input and output terminal 21. The capacitor 4c, one end of which is grounded, is connected to the resistor 22, which is connected to the third central conductor 7.

The isolation characteristic and the frequency characteristic of the isolator can be adjusted by cutting the capacitors 4a, 4b, and 4c, the resistor 22, and the inductors 23, 24, 25, and 26 after the first and second yokes 10 and 11 are covered. Therefore, such a structure allows more precise adjustment, compared with an isolator which is adjusted and then is covered by yokes.

Figure 11:
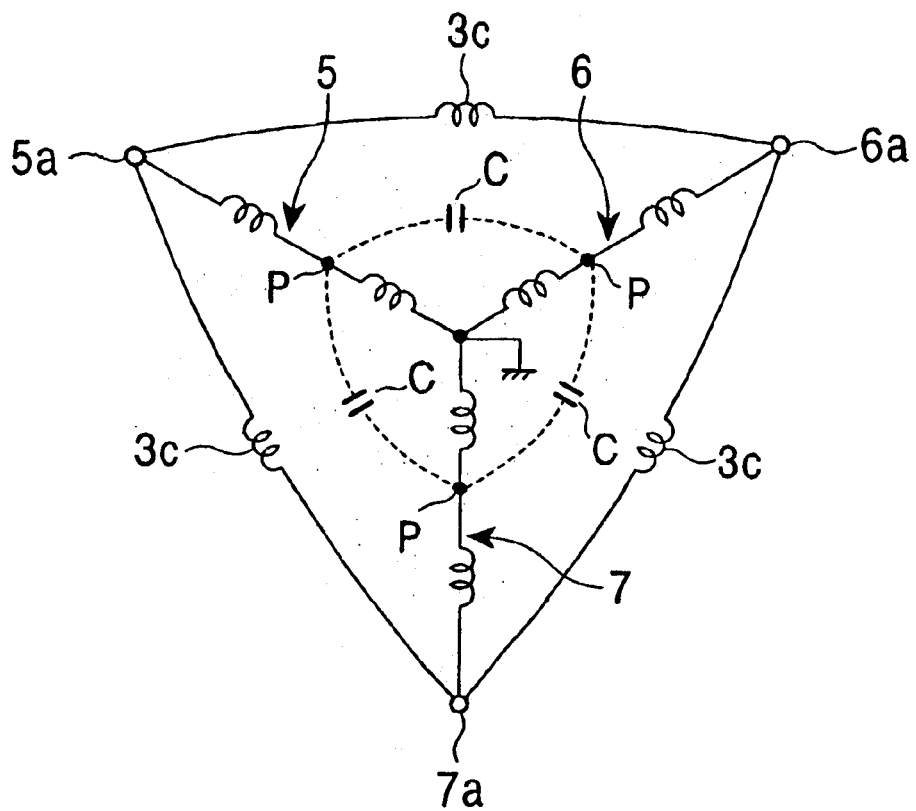
FIG. 11 is an equivalent circuit diagram of a circulator according to the present invention.

In this circulator S1, as shown in an equivalent circuit diagram of FIG. 11, input and output terminals 5a, 6a, and 7a are provided for the central conductors 5, 6, and 7, respectively, at one end of each central conductor, and the other end of each central conductor is grounded. The central conductors 5, 6, and 7 are coupled with each other by capacitive components C formed between intersections P. Between the input and output terminals 5a, 6a, and 7a, microstriplines 3c are connected.

Figure 12:
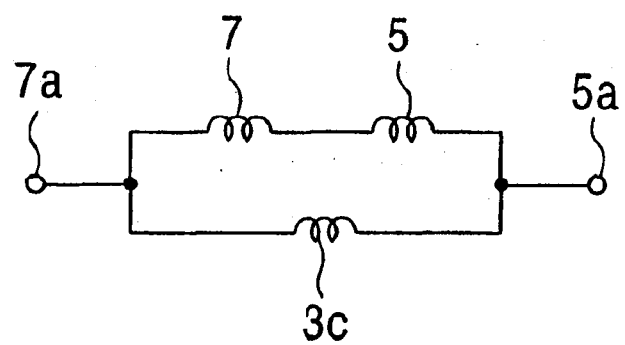
FIG. 12 is an equivalent circuit diagram of the circulator, obtained between two input and output terminals when a signal is output.

FIG. 12 shows an equivalent circuit obtained when a signal input to the input and output terminal (for example, the terminal 7a) of one central conductor (for example, the central conductor 7) is induced by the Faraday effect on another central conductor (for example, the central conductor 5) and output from its input and output terminal (for example, the terminal 5a). Between two input and output terminals 7a and 5a, two central conductors 7 and 5 are connected in parallel to a microstripline 3c. Since the microstripline 3c has a larger inductance than the total of two central conductors (7 and 5), the inductance of the microstripline 3c can be ignored, and the signal is output to the input and output terminal 5a of the central conductor 5.

Figure 13:
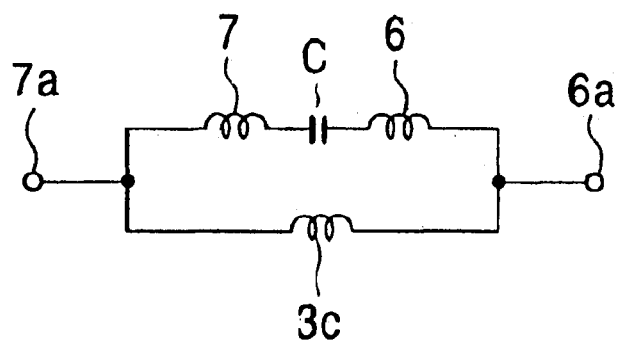
FIG. 13 is an equivalent circuit diagram of the circulator, obtained between two input and output terminals when a signal is not output.
Figure 14:
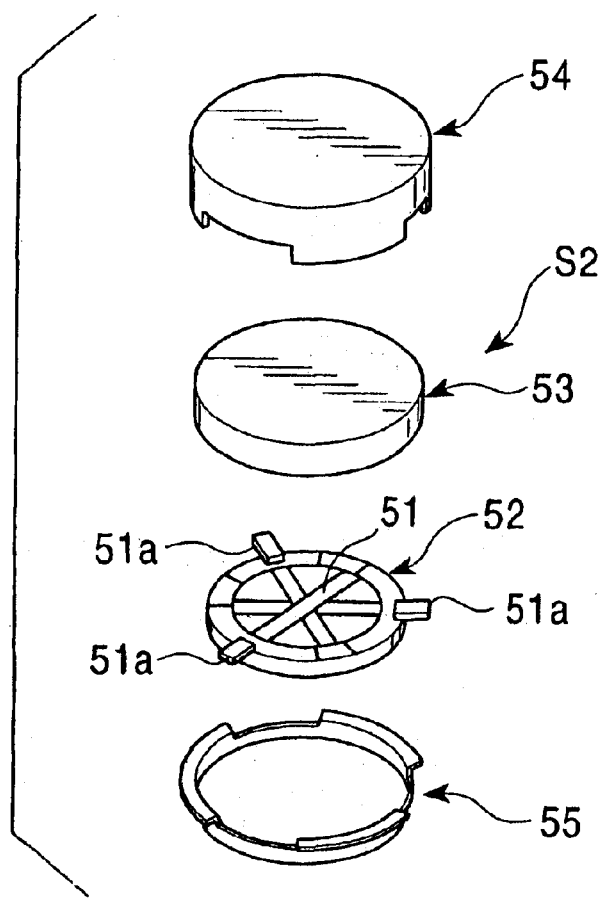
FIG. 14 is an exploded, perspective view of a conventional circulator.
Figure 15:
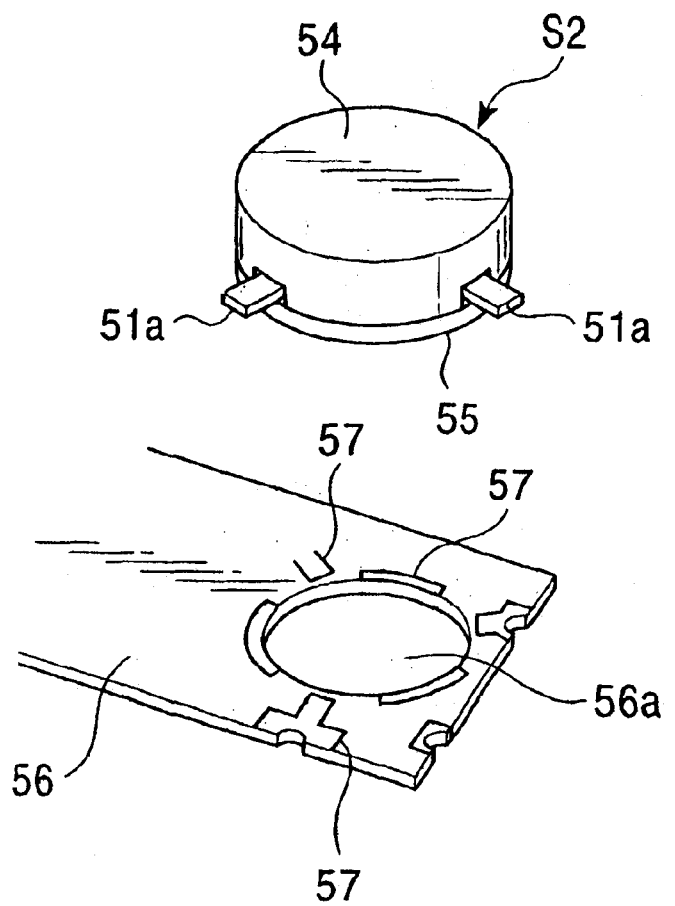
FIG. 15 is an exploded, perspective view of the conventional circulator.
Figure 16:
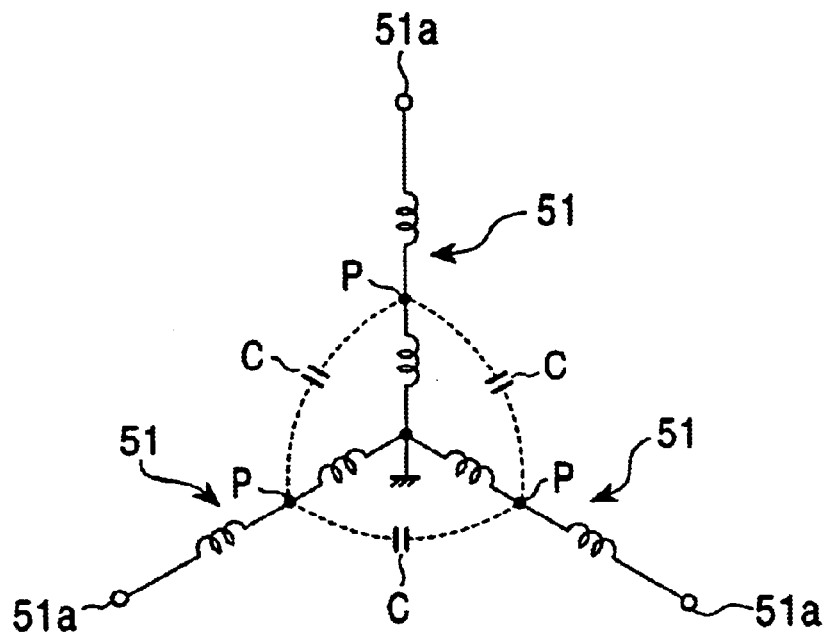
FIG. 16 is an equivalent circuit diagram of the conventional circulator, obtained among three input and output terminals.
Figure 17:
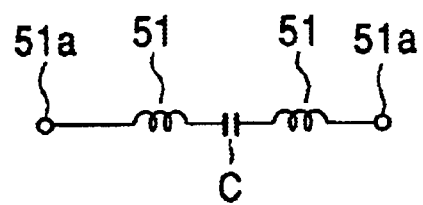
FIG. 17 is an equivalent circuit diagram of the conventional circulator, obtained between two input and output terminals when a signal is not output.

FIG. 13 shows an equivalent circuit obtained when a signal input to the input and output terminal (for example, the terminal 7a) of one central conductor (for example, the central conductor 7) is not induced by the Faraday effect on another central conductor (for example, the central conductor 6) or output from its input and output terminal (for example, the terminal 6a). Between two input and output terminals 7a and 6a, two central conductors 7 and 6 are connected with a capacitive component C disposed therebetween, in parallel to the microstripline 3c. When the inductor of the microstripline 3c and the capacitive component resonate at the signal frequency, the signal is not output from the input and output terminal 6a of the central conductor 6, and isolation is enhanced.

The resonant frequency is adjusted by trimming the microstripline 3c.

In an electronic circuit unit having the circulator S1, according to the present invention, the circulator S1 is formed by using a part of the circuit board 1 and is manufactured during a process of manufacturing an electronic circuit in the circuit board 1. Therefore, a more compact electronic circuit unit having a circulator, which requires a smaller space and is manufactured with a higher productivity than a conventional one is provided.

Since the plurality of through holes 1e passing through the circuit board 1 vertically are filled with the magnetic material 12, and the magnetic material 12 forms a magnetic path between the first and second yokes 10 and 11 disposed above and below the circuit board 1 so as to cover the magnet 8 and the ferrite member 9, to make a closed magnetic circuit, the first and second yokes 10 and 11 can be made compact, and an electronic circuit unit according to the present invention can be provided with a closed magnetic circuit by the magnetic material 12.

Since the through holes 1e are filled with the magnetic material 12 made from a paste including a magnetic powder, the structure is simple and an electronic circuit unit according to the present invention can be manufactured with a high productivity.

Since at least one of the first and second yokes 10 and 11 has the cylindrical side wall 10b, and the dielectric substrates 2 are provided with the ring-shaped magnetic patterns 13 which are disposed opposite the end section of the side wall 10b and connected to the magnetic material 12, a magnetic path is always obtained between the first and second yokes 10 and 11, and an electronic circuit unit having a good closed magnetic circuit is obtained.

Since a magnetic pattern 13 is provided for each of the dielectric substrates 2 disposed between the first and second yokes 10 and 11, a magnetic path is always obtained between the first and second yokes 10 and 11, and an electronic circuit unit having a good closed magnetic circuit is obtained.

The ferrite member 9 is disposed in the cavity 1a; the magnet 8 is disposed on the upper surface of the circuit board 1; the first yoke 10 having the cylindrical side wall 10b is disposed so as to cover the outside of the magnet 8;

the plate-shaped second yoke 11 is disposed so as to cover the outside of the ferrite member 9 and to block the cavity 1a. Therefore, the first and second yokes 10 and 11 have simple shapes and become compact; and a compact electronic circuit unit having a circulator, manufactured with a high productivity, is provided.

An electrically conductive pattern 3 is formed on the front surface of the first-layer dielectric substrate 2 disposed at the top layer of the circuit board 1; the first, second, and third central conductors 5, 6, and 7 are formed on dielectric substrates 2 disposed below the first-layer dielectric substrate 2; and one end of each of the first, second, and third central conductors 5, 6, and 7 is connected to the electrically conductive pattern 3 through the through-hole conductor 14 filled in a hole 1c provided for the circuit board 1. Therefore, the input and output terminals 21 of the circulator S1 are placed on the upper surface, wiring becomes simple, and an electronic circuit unit manufactured with a high productivity is provided.

Since the other end of each of the first, second, and third central conductors 5, 6, and 7 is grounded through a through-hole conductor 15 filled in a hole 1d provided for the circuit board 1 at a position closer to the center than the ring-shaped magnetic patterns 13, the grounding sides of the first, second, and third central conductors 5, 6, and 7 do not cross the ring-shaped magnetic patterns 13. Therefore, the cut sections 13a of the magnetic patterns 13 reduced, and grounding is achieved at a space small in the radial direction.

Since the through-hole conductor connected to the other end of each of the first, second, and third central conductors 5, 6, and 7 is connected to the highly electrically conductive member 19, grounding is achieved with a low electric resistance.

On the upper surface of the circuit board 1, the capacitors 4a, 4b, and 4c for the circulator S1 are formed by printing at positions outside the first yoke 10, and the capacitors 4a, 4b, and 4c can be trimmed after the first yoke 10 has been mounted. Although the capacitors 4a, 4b, and 4c can be formed during a manufacturing process for the circuit board 1, trimming is possible after the electronic circuit unit has been completed. A high-performance electronic circuit unit is thus provided.

In a circulator according to the present invention, one end of each of three central conductors disposed at intervals of 120 degrees serves as an input and output terminal, and adjacent input and output terminals are connected by inductive elements, capacitive components generated between the central conductors and the inductive elements form a parallel resonant circuit. The level of an output signal leaked to an input and output terminal, which is not to be output by the Faraday effect, is reduced.

Since electrically conductive patterns connected to input and output terminals, and microstriplines for connecting electrically conductive patterns, are formed on a circuit board, and the microstriplines are formed of inductive elements, the inductance of each microstripline is adjusted by trimming in a simple manner.

Since the resonant frequency of the parallel resonant circuit formed of the inductive element, and the capacitive components generated between the central conductors because the central conductors intersect with each other, is made equal to the frequency of a signal input to an input and output terminal, the level of an output signal leaked is made extremely low.

What is claimed is:

1. An electronic circuit unit having a circulator, comprising:

a circuit board which is obtained by laminating a plurality of dielectric substrates and in which an electric component is provided to form a desired electronic circuit;

first, second, and third central conductors provided for the circuit board and partially intersecting with each other in the upper and lower directions;

a magnet and a ferrite member disposed above and below the intersection of the central conductors;

a first yoke for covering the outside of the magnet; and a second yoke for covering the outside of the ferrite member, wherein the first, second, and third central conductors are provided on the plurality of dielectric substrates and are formed by laminating the plurality of dielectric substrates;

a cavity for accommodating the ferrite member is provided at a lower section of the circuit board in which the central conductors are disposed;

a plurality of through holes vertically passing through the circuit board are filled with a magnetic material; and a magnetic path is formed by the magnetic material between the first and second yokes disposed above and below the circuit board so as to cover the magnet and the ferrite member, to make a closed magnetic circuit.

2. An electronic circuit unit having a circulator according to claim 1, wherein the magnetic material is formed by filling the through holes with a paste including a magnetic powder.

3. An electronic circuit unit having a circulator according to claim 1, wherein at least one of the first and second yokes has a cylindrical side wall, and the dielectric substrate is provided with a ring-shaped magnetic pattern which opposes the end section of the side wall and which is connected to the magnetic material.

4. An electronic circuit unit having a circulator according to claim 1, wherein an electrically conductive pattern is provided on the front surface of a first-layer dielectric substrate disposed at the top of the circuit board;

the first, second, and third central conductors are provided on dielectric substrates disposed below the first-layer dielectric substrate; and one end of each of the first, second, and third central conductors is connected to the electrically conductive pattern by a through-hole conductor filled in a hole provided in the circuit board.

5. An electronic circuit unit having a circulator according to claim 3, wherein the magnetic pattern is provided for each of the dielectric substrates positioned between the first and second yokes.

6. An electronic circuit unit having a circulator according to claim 3, wherein the ferrite member is disposed in the cavity;

the magnet is disposed on the upper surface of the circuit board;

the first yoke having the cylindrical side wall is disposed so as to cover the outside of the magnet; and the second yoke having a plane shape is disposed so as to cover the outside of the ferrite member and to block the cavity.

7. An electronic circuit unit having a circulator according to claim 4, wherein the other end of each of the first, second, and third central conductors is grounded through a through-hole conductor filled in a hole provided in the circuit board at a position closer to the center than the ring-shaped magnetic pattern.

8. An electronic circuit unit having a circulator according to claim 6, wherein a capacitor for the circulator is provided on the upper surface of the circuit board by printing at a position outside the first yoke, and the capacitor can be trimmed after the first yoke has been mounted.

9. An electronic circuit unit having a circulator according to claim 7, wherein the through-hole conductor connected to the other end of each of the first, second, and third central conductors is connected to one highly electrically conductive member.

10. An electronic circuit unit having a circulator, comprising:

a circuit board obtained by laminating a plurality of dielectric substrates;

first, second, and third central conductors provided for the plurality of dielectric substrates at intervals of 120 degrees and partially intersecting with each other in the upper and lower directions;

a magnet and a ferrite member disposed above and below the intersection of the central conductors;

a first yoke for covering the outside of the magnet: and a second yoke for covering the outside of the ferrite member, wherein one end of each of the first, second, and third central conductors serves as an input and output terminal, the ends being disposed at intervals of 120 degrees; and adjacent input and output terminals are connected by a plurality of inductive elements, a capacitive component being disposed between at least two inductive elements.

11. An electronic circuit unit having a circulator according to claim 10, wherein electrically conductive patterns are connected to the input and output terminals, and microstriplines for connecting the electrically conductive patterns are provided on the circuit board; and the microstriplines are formed of the inductive elements.

12. An electronic circuit unit having a circulator according to claim 10, wherein the resonant frequency of a parallel resonant circuit formed of the inductive elements and the capacitive component generated between the central conductors by the intersections of the central conductors is made equal to the frequency of a signal input to the input and output terminals.

13. An electronic circuit unit having a circulator according to claim 11, wherein the resonant frequency of a parallel resonant circuit formed of the inductive elements and the capacitive component generated between the central conductors by the intersections of the central conductors is made equal to the frequency of a signal input to input and output terminals.

* * * * *

UNITED STATES PATENT AND TRADEMARK OFFICE
CERTIFICATE OF CORRECTION

PATENT NO. : 6,741,478 B2
DATED : May 25, 2004
INVENTOR(S) : Yuichi Shimizu et al.

It is certified that error appears in the above-identified patent and that said Letters Patent is hereby corrected as shown below:

<u>Column 12</u>
Line 27, after "signal input to" insert -- the --.

Signed and Sealed this

Thirtieth Day of November, 2004

JON W. DUDAS
*Director of the United States Patent and Trademark Office*